United States Patent [19]

Heller et al.

[11] 4,343,887
[45] Aug. 10, 1982

[54] SENSITIZING BATH FOR SILVER CONTAINING RESIST

[75] Inventors: Adam Heller, Bridgewater; Richard G. Vadimsky, Somerville, both of N.J.

[73] Assignee: Bell Telephone Laboratories, Incorporated, Murray Hill, N.J.

[21] Appl. No.: 263,684

[22] Filed: May 14, 1981

[51] Int. Cl.$^3$ ............................................. G03C 5/00
[52] U.S. Cl. .................... 430/272; 156/659.1; 156/662; 427/85; 430/270; 430/275; 430/311; 430/313; 430/317; 430/318; 430/321; 430/325; 430/564

[58] Field of Search ............... 430/270, 271, 272, 273, 430/275, 311–321, 322–323, 325–326, 564; 428/434; 427/85, 89, 92, 98, 169; 156/662, 659.1

[56] References Cited

U.S. PATENT DOCUMENTS

| | | | |
|---|---|---|---|
| 4,127,414 | 11/1978 | Yoshikawa et al. | 430/313 |
| 4,214,249 | 7/1980 | Kasai et al. | 430/306 |
| 4,269,935 | 5/1981 | Masters et al. | 430/314 |
| 4,276,368 | 6/1981 | Heller et al. | 430/313 |

OTHER PUBLICATIONS

Applied Physics Letters, "A New Inorganic Electron Resist of High Contrast", A. Yoshikawa, O. Ochi, H. Nagai and Y. Mizushima, vol. 31, Aug. 1, 1977, pp. 161–163.

Journal of Vacuum Science and Technology, "Bilevel High Resolution Photolithographic Technique for Use with Wafers with Stepped and/or Reflecting Surfaces", K. L. Tai, W. R. Sinclair, R. G. Vadimsky and J. M. Moran, vol. 16, Nov./Dec. 1979, pp. 1977–1979.

*Primary Examiner*—Mary F. Downey
*Attorney, Agent, or Firm*—Richard D. Laumann

[57] ABSTRACT

Fabrication of a resist, useful for high resolution pattern delineation and having a silver containing layer on a glassy material, produces better results when the sensitizing bath contains both potassium silver cyanide and a metal cyanide complex capable of providing $CN^-$ ions to shift the equilibrium of $Ag(CN)_2^- \rightleftarrows AgCN + CN^-$ to the left.

12 Claims, No Drawings

SENSITIZING BATH FOR SILVER CONTAINING RESIST

TECHNICAL FIELD

This invention relates generally to lithographic processing and particularly to sensitizing baths for silver containing resists used in lithographic processing.

BACKGROUND OF THE INVENTION

The production of high resolution patterned images used in the fabrication of miniaturized circuits is important in modern technology. These circuits are useful in logic circuits, memory devices, etc., which, in turn, form the components of devices such as calculators, computers, etc. The production of the patterned images generally involves coating a wafer with a radiation curable material, commonly called a resist, and exposing selected portions of the resist to radiation which initiates reactions within the exposed portion of the resist and causes the exposed portion to become either more or less easily removed, i.e., more or less soluble, with respect to the unexposed portion when the resist is subjected to an appropriate developer. The circuit and device fabrication sequence thus begins with the resists being coated onto wafers composed of materials, e.g., silicon, used in the manufacture of large scale integration devices, e.g., random access memories, etc. The wafer thus serves as a substrate for the resist. After portions of the resist are exposed to radiation and the more soluble portions removed by development, the now bared substrate portions are modified by, e.g., removal of substrate material or deposition of new material on or into the substrate. The production of many types of devices, for example, semiconductor integrated circuits, requires that the described processing sequence be repeated several times, i.e., the remaining resist is stripped off after substrate modification and a new layer of resist is put down and exposed, etc. The patterned resist may itself also act as a dry processing mask to permit replication in an underlying and relatively thick second resist layer which accommodates substrate surface roughness and permits presentation of a smooth surface to the incident radiation.

A successful lithographic system, i.e., a system which produces high resolution patterned images, requires the availability of a resist which has several desirable properties including both good sensitivity to the incident radiation and good adhesion to the substrate. Furthermore, the resist should exhibit good reproducibility, both between batches of resist material and from coated wafer to coated wafer within a batch of resist material of these properties.

Several classes of materials have been considered as candidates for use as resists. Inorganic resists, such as those containing silver halides, have received some attention from those engaged in developing resists, but most of the effort directed to resist development has been devoted to organic resists. Recently, however, the effort directed toward the development of inorganic resists has greatly increased because of advantages theoretically offered by this class of resists. One such advantage of inorganic resists, as compared to organic resists, is a generally high absorption cross-section for most commonly used electromagnetic radiation. This results in essentially total radiation absorption within the usual resist layer thickness and thus avoids any depth dependence of the exposure caused by standing waves.

One example of an inorganic resist is described in *Applied Physics Letters*, 31, pp. 161-163, Aug. 1, 1977. The inorganic resist described is, before exposure, in the form of a thin silver layer supported by a selenium-germanium radiation absorbing layer that is disposed on a substrate. The resist operation depends on the photoinduced silver migration into the exposed portions of the selenium-germanium, i.e., chalcogenide layer to reduce the solubility of the exposed, i.e., silver containing, portions of the chalcogenide layer in an alkaline developer. Another inorganic resist is described in *Journal of Vacuum Science and Technology*, 16, pp. 1977-1979, November/December, 1979. This article described a resist system based on the photoinduced migration of silver into any member of a family of glassy chalcogenide materials. The system regularly attains submicron resulution. The silver is introduced into the resist not from an elemental form as in the previously mentioned *Applied Physics Letters* but from either a combined or complexed form which is chosen to interact with one or more components of the glassy layer to yield a layer of a silver compound disposed on the underlying glassy layer. The silver compound so formed then serves as a migration source of silver ions when the resist is exposed to radiation. It is hypothesized that the photoinduced migration proceeds through a mechanism that involves electron-hole pair generation by absorbed photons with the holes combining with silver. The resulting migration is thus truly the migration of silver cations.

While a number of methods and silver containing compositions may be utilized to introduce the silver containing layer onto the glassy chalcogenide layer, it was found convenient to form the silver containing layer by dipping the chalcogenide glass coated wafer in an aqueous solution, commonly called a sensitizing bath, of an alkaline metal silver cyanide such as $KAg(CN)_2$. The silver cyanide reacts with the chalcogenide layer to form $Ag_2Se$ which serves as the source for silver migration. A small $CN^-$ concentration, over the stoichiometric concentration for the reaction (1) $[Ag(CN)_2]^- \rightleftharpoons CN^- + AgCN$, is required for proper bath performance. Too large a $CN^-$ concentration results in Ge-Se layer degradation while a $CN^-$ concentration below stoichiometric for reaction (1) results in the precipitation of the insoluble compound, AgCN. The cyanide concentration produced by the reaction of silver cyanide and the chalcogenide is not sufficient to produce the desired $CN^-$ concentration. The desired cyanide concentration has been obtained according to the teaching of the prior art by adding KCN to the sensitizing bath. While the resists formed by the method described are perfectly adequate for many purposes, it has been found that wafers coated in the same sensitizing bath may exhibit differences in sensitivity.

SUMMARY OF THE INVENTION

We have found that in a method of fabricating an article comprising the steps of forming a silver containing layer on a glassy layer by immersing said glassy layer in a sensitizing bath, said glassy layer being disposed on a substrate, the sensitizing bath used to form the silver containing layer comprises a metal cyanide complex and a silver cyanide complex. The metal cyanide complex is less stable than the silver cyanide complex, i.e., it introduces into the solution a cyanide ion concentration exceeding that from the equilibrium of the reaction (1) $[Ag(CN)_2]^- \rightleftharpoons AgCN + CN^-$. The metal cyanide complex may be a complex such as the cadmium cyanide complex, $Cd(CN)_4^{2-}$ or the zinc cyanide complex, $Zn(CN)_4^{2-}$. The amount of excess cyanide added by the metal cyanide complex is desirably between 0.001 and 1.0 molar. The metal cyanide complex provides a reservoir of cyanide, i.e., it maintains an approximately constant cyanide concentration, and reduces variations in resist sensitivity from wafer to wafer caused by the oxidative elimination of cyanide from the sensitizing bath. In a preferred embodiment, the glassy chalcogenide layer is the glass $GeSe_x$, x greater than or equal to 2.

DETAILED DESCRIPTION

The glass compositions, i.e., resists, useful with the sensitizing bath of this invention must be able to accommodate photoinduced migration of a silver species, i.e., the glass must be a silver ion conductor. In addition to this requirement, the glass compositions must also satisfy other requirements such as having an absorption cross-section sufficiently large for the selected incident radiation to yield the desired resist sensitivity and being both amenable to deposition on a substrate in the required quality and soluble in a solvent which discriminates to the necessary extent between the exposed and unexposed resist regions. The glass compositions appropriate for the practice of this invention generally contain selenium, tellurium or sulphur, i.e., a chalcogenide, and may be binary, ternary or even more complex. Such glasses are well known and include compositions based upon mixing the chalcogenide element with, for example, germanium, arsenic, iodine, or bismuth. In general, the glass composition used is selected with regard to its absorption cross-section for the radiation used during exposure.

Typical glass layer thicknesses are 2000 Angstroms or less. The glass layer is deposited on the substrate by well-known techniques such as evaporation and rf sputtering. The substrate typically comprises a semiconductor such as Si or GaAs or a garnet. The silver containing layer is formed by immersing the glass layer coated substrate in a silver complex containing sensitizing bath at a temperature of, for example, 25 degrees Celsius, for a residence time between approximately one second and several minutes to produce the appropriate layer thickness. The silver containing layer thus formed on the glass consists essentially of at least one chemical compound consisting of the reaction product of the silver complex, e.g., $Ag(CN)_2^-$, and at least one component of the glass. The silver containing layer desirably has a thickness between 50 Angstroms and 150 Angstroms. Thicker silver containing layers may have too much light absorption within the layer to yield the necessary sensitivity while thinner silver containing layers may have an amount of silver that is inadequate for the formation, by photoinduced silver ion migration, of a developer resistant surface.

Our invention will be illustrated by reference to a particular chalcogenide glass, namely, $GeSe_x$ with x equal to or greater than 2 and less than approximately 100. The use of lesser amounts of selenium, i.e., x less than 2, is undesirable as it may result in the formation of crystalline material rather than a glass.

The sensitizing bath contains a silver cyanide complex which reacts with one or more of the glass components to form the silver containing layer disposed on the glass, generally chalcogenide, layer. The silver is conveniently introduced into the bath as a silver cyanide compound such as aqueous $KAg(CN)_2$. The silver concentration is desirably within the range extending from 0.01 molar to 0.5 molar to obtain reasonable rates of silver deposition. The solution should be basic to form the silver containing layer which, for a $GeSe_x$ resist, consists essentially of $Ag_2Se$. A pH of approximately 10 has been found to yield good results.

Fabrication of reproducible silver containing layers at reproducible rates requires a constant excess cyanide concentration in the bath over the stoichiometry for reaction (1). Maintenance of a constant low, but adequate, $CN^-$ concentration in the bath is essential for its reproducible performance. A preferred range for the excess cyanide concentration is between approximately 0.001 and approximately 1.0 molar. While some increase in cyanide concentration results from the deposition of silver from the silver cyanide complex $Ag(CN)_2$, this quantity is not sufficient to yield the required concentration. If the excess cyanide concentration becomes too low, less than 0.001 molar, AgCN, an insoluble compound, is likely to form and precipitate. This precipitate, unless completely removed, causes defects in the final pattern. However, if the excess cyanide concentration becomes too great, i.e., greater than 1.0 molar, the quality of the $GeSe_x$ layer will degrade. The addition of a small excess of KCN to the sensitizing bath, as previously mentioned, may suffice for a short time period but for extended time periods, the free cyanide added by this method reacts with atmospheric oxygen dissolved in the bath, possibly to form a cyanate, and the bath does not yield resists having uniform sensitivities.

A cyanide concentration within the desired range is maintained if the cyanide is added to the semsitization bath as a metal cyanide complex in which the cyanide ion is less strongly complexed than in the $Ag(CN)_2^-$ complex. That is, the sensitizing bath further comprises a metal cyanide complex which is less stable than is the silver cyanide complex, i.e., the cyanide ion concentration is higher at equilibrium from $M(CN)_4^- \rightleftharpoons M(CN)_2 + 2CN^-$, where M is any metal, than it is for $Ag(CN)_2^- \rightleftharpoons AgCN + CN^{31}$ at equilibrium. Thus, the complexed metal cyanide provides a reservoir of cyanide which replenishes the cyanide lost through oxidative elimination but which does not increase the cyanide ion concentration in the bath to undesired high concentrations.

A specific example of a suitable metal cyanide complex is the cadmium cyanide anion, $Cd(CN)_4^{2-}$, which is conveniently introduced into the bath as $K_2Cd(CN)_4$. Another example of a suitable metal cyanide complex is the zinc cyanide anion, $Zn(CN)_4^{2-}$, which is conveniently introduced to the bath as $K_2Zn(CN)_4$.

A preferred bath has approximately 0.2 M of both potassium silver cyanide, $KAg(CN)_2$, and potassium cadmium cyanide, $K_2Cd(CN)_4$. This concentration has been found desirable because of the reproducible results obtained. This bath yielded reproducible results after air had been bubbled through it for 11 days.

After the silver containing layer has been formed, pattern delineation proceeds by exposure, either direct writing or through a mask, of the resist by radiation such as electromagnetic radiation having wavelengths up to approximately 4300 Angstroms. This is followed by development in solvents that are desirably specific to particular glass components. For $GeSe_x$, x greater than or equal to 2, a basic, pH of 12.5 borohydride solution or a basic, pH of 12.5 sulfide solution, such as $Na_2S$, yield good lithographic results.

What is claimed is:

1. A method of fabricating an article comprising forming a silver containing layer of material on a layer of glassy material, said glassy material being disposed on a substrate, said silver containing material consisting essentially of at least one chemical compound consisting of the reaction product of a silver complex and at least one component of the material, said forming being by immersion of said glassy material in a sensitizing bath comprising a silver cyanide complex and a metal cyanide complex which introduces into the solution a $CN^-$ ion concentration exceeding that of the cyanide ion concentration from $Ag(CN)_2^- \rightleftharpoons CN^- + AgCN$ at equilibrium.

2. A method as recited in claim 1 in which said excess $CN^-$ concentration is between approximately 0.001 molar and approximately 1.0 molar.

3. A method as recited in claim 1 in which said glassy material contains at least one chalcogenide element.

4. A method as recited in claim 3 in which said chalcogenide is selenium.

5. A method as recited in claim 4 in which said glassy material has the composition $GeSe_x$, x being greater than or equal to 2.

6. A method as recited in claims 2 or 3 in which said silver complex is $Ag(CN)_2^-$.

7. A method as recited in claim 6 in which said silver complex is introduced as $KAg(CN)_2$.

8. A method as recited in claim 7 in which said silver cyanide concentration is approximately 0.2 M.

9. A method as recited in claim 6 in which said metal cyanide complex is selected from the group consisting of $Cd(CN)_4^{2-}$ and $Zn(CN)_4^{2-}$.

10. A method as recited in claim 9 in which said metal cyanide complex is $Cd(CN)_4^{2-}$ and has a concentration of approximately 0.2 M.

11. A method as recited in claim 6 in which said substrate comprises a semiconductor.

12. A method as recited in claim 11 in which said semiconductor is selected from the group consisting of GaAs and Si.

* * * * *